United States Patent [19]

Tanizawa

[11] Patent Number: 5,475,261

[45] Date of Patent: Dec. 12, 1995

[54] SEMICONDUCTOR DEVICE HAVING MANY LEAD PINS

[75] Inventor: Tetsu Tanizawa, Kawasaki, Japan

[73] Assignee: Fujitsu Limited, Kawasaki, Japan

[21] Appl. No.: 164,784

[22] Filed: Dec. 10, 1993

Related U.S. Application Data

[63] Continuation of Ser. No. 858,962, filed as PCT/JP91/01242, Sep. 19, 1991, abandoned.

[30] Foreign Application Priority Data

Sep. 19, 1990 [JP] Japan .................. 2-249348
Sep. 19, 1990 [JP] Japan .................. 2-249349

[51] Int. Cl.⁶ ................. H01L 23/02; H01L 23/12; H01L 23/48; H01L 29/44
[52] U.S. Cl. ............. 257/693; 257/692; 257/698
[58] Field of Search ................ 357/74, 80; 257/692, 257/693, 694, 695, 696, 697, 698, 700

[56] References Cited

U.S. PATENT DOCUMENTS

| | | | |
|---|---|---|---|
| 4,530,002 | 7/1985 | Kanai | 257/697 |
| 5,102,829 | 4/1992 | Cohn | 257/692 |
| 5,107,329 | 4/1992 | Okinaga et al. | 257/698 |

FOREIGN PATENT DOCUMENTS

| | | | |
|---|---|---|---|
| 2622741 | 5/1989 | France . | |
| 0030382 | 3/1977 | Japan | 357/74 |
| 0003440 | 1/1986 | Japan | 357/74 |
| 0280432 | 11/1988 | Japan | 357/74 |
| 1-230264 | 9/1989 | Japan | 257/697 |
| 1-318251 | 12/1989 | Japan | H01L 23/04 |
| 2-30172 | 1/1990 | Japan | H01L 23/50 |
| 2-106943 | 4/1990 | Japan | H01L 21/60 |
| 2-125650 | 5/1990 | Japan | H01L 23/50 |
| 2-148860 | 6/1990 | Japan | H01L 23/50 |
| 0148165 | 6/1991 | Japan | 357/74 |
| 0205859 | 9/1991 | Japan | 357/74 |

OTHER PUBLICATIONS

Patent Abstracts of Japan, vol. 12, No. 60 (E–584) 23 Feb. 1988 & JP–A–62 202 544 (Mitsubishi Electric Corp.).

*Primary Examiner*—Sara W. Crane
*Assistant Examiner*—S. V. Clark
*Attorney, Agent, or Firm*—Staas & Halsey

[57] ABSTRACT

A semiconductor device includes a predetermined number of surface mount first lead pins (14), arranged around the periphery of the underside of a package (13) fitted with a chip (11). A predetermined number of second lead pins (22, 41), each having a specific function, are provided in a region near the center of the underside of the package (13) inside of the region populated with the first lead pins (14).

13 Claims, 14 Drawing Sheets

SEMICONDUCTOR DEVICE HAVING MANY LEAD PINS

This application is a continuation, of application Ser. No. 07/858,962, filed as PCT/JP91/01242, Sep. 19, 1991, now abandoned.

FIELD OF THE INVENTION

The present invention relates to a semiconductor device, and particularly to a semiconductor device with a high lead density in the package.

BACKGROUND ART

Figure 1A:
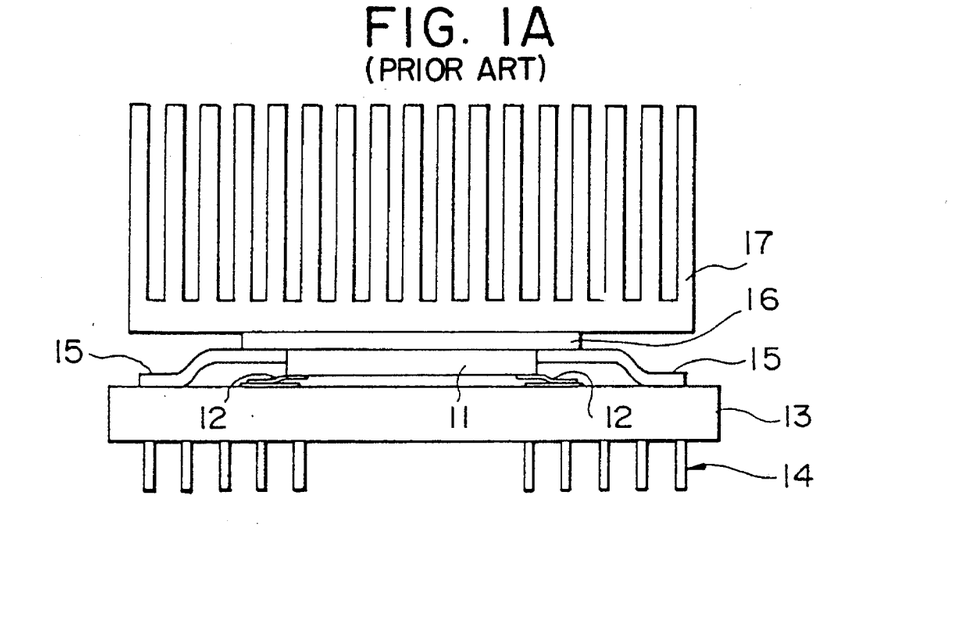
FIGS. 1A and 1B are cross-sectional views of an embodiment of a semiconductor device of the prior art.
Figure 1B:
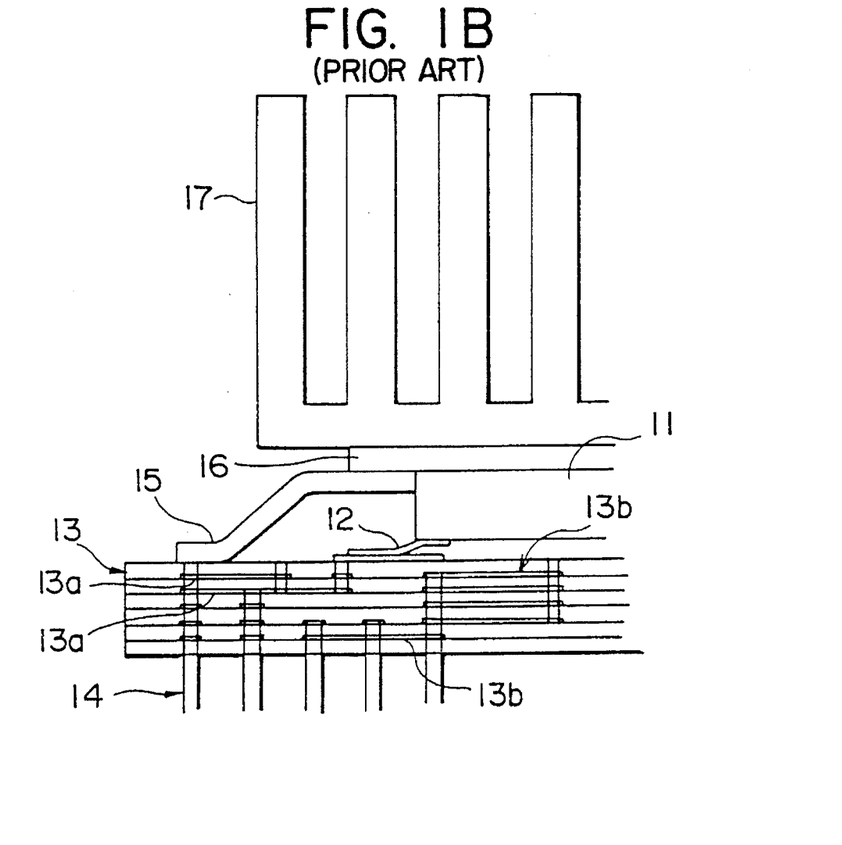

FIGS. 1A and 1B are cross-sectional views of a semiconductor device according to the prior art.

FIG. 1A is a cross-sectional view of a semiconductor device comprising a high-power chip 11 and a heat sink 17. Bumps are formed on the face of the chip with the elements, and are bonded to TAB (Tape Automated Bonding) leads 12. This assembly is mounted onto and connected with a layer-built ceramic package 13. A large number of regularly spaced surface mount pins 14 project perpendicularly from an underside of the ceramic package. Power is supplied, and signals are input and output through the pins 14.

The chip 11 is encased in a metal cap 15 with its top side partially exposed. A heat sink 17 is soldered or brazed onto a top side of the chip 11, through a metal plate 16. The metal plate 16 is made of a material such as CuMo, in an attempt to make compatible the coefficients of thermal expansion of the chip 11 and of the aluminum heat sink 17.

FIG. 1B is a partial cross-sectional view of the package shown in FIG. 1A. The ceramic package 13 is constructed of ceramic layers on which is formed a pattern 13a or a power plane 13b. The pattern 13a and the power plane 13b are connected to corresponding pins 14 in the same process that the chip 11 is connected to the TAB leads 12 on which the chip is mounted by means of the bumps.

The semiconductor device illustrated in FIGS. 1A and 1B is of a PGA (Pin Grid Array) type designed for increased pin population and high pin density, allowing a plurality of leads 14 to project from the underside of the package 13.

When surface mounting the semiconductor device onto a board, it is necessary to visually confirm whether device has been successfully connected to the board. Since visual inspection is performed by microscopes and other means, the pins 14 are provided at a periphery of the underside of the ceramic package 13, within the range where visual inspection is possible, as shown in FIGS. 1A and 1B.

There is a disadvantage in this, in that visual inspection is limited to 4–6 rows of pins, prohibiting pin array placement toward the center region, and creating an area that is not usable.

DISCLOSURE OF THE INVENTION

An object of the present invention is to provide a semiconductor device capable of eliminating the aforementioned disadvantage.

A more specific object of the present invention is to provide a semiconductor device that allows pins to be provided on the entire underside of a package, without having to leave any area thereof unused, and that eliminates the necessity of visual inspection.

The present invention achieves the above objects by providing a semiconductor device comprising a predetermined number of surface mount lead pins provided at the periphery of the underside of a package fitted with a chip; and at least one lead part, each lead part provided being assigned for a specific use, and being provided near the center region of the underside of the package, beyond the region populated with lead pins.

The objects of the present invention can also be achieved by a semiconductor device comprising a predetermined number of surface mount lead pins provided at the periphery of the underside of a package fitted with a predetermined number of chips; thin films built with interposed layers of film etched with desired patterns, for connecting the chips and the lead pins; and lead parts each assigned for a specific use, provided near the center region of the underside of the package inside of the periphery populated with the lead pins, and connected directly to the chips.

The objects of the present invention can also be achieved by a semiconductor device comprising a predetermined number of lead terminals projecting from all four sides of a package fitted with a chip; and at least one lead part, each provided lead part being assigned for a specific use, and provided on the underside of the package.

BRIEF DESCRIPTION OF THE DRAWINGS

A clearer understanding of other objects, characteristics and utility of the present invention will be obtained by reading the explanation given below with reference to the drawings detailed below.

FIGS. 13A to 13I illustrate a fabrication process of a thin film such as the one shown in FIG. 12A.

DESCRIPTION OF THE PREFERRED EMBODIMENTS

Figure 2:
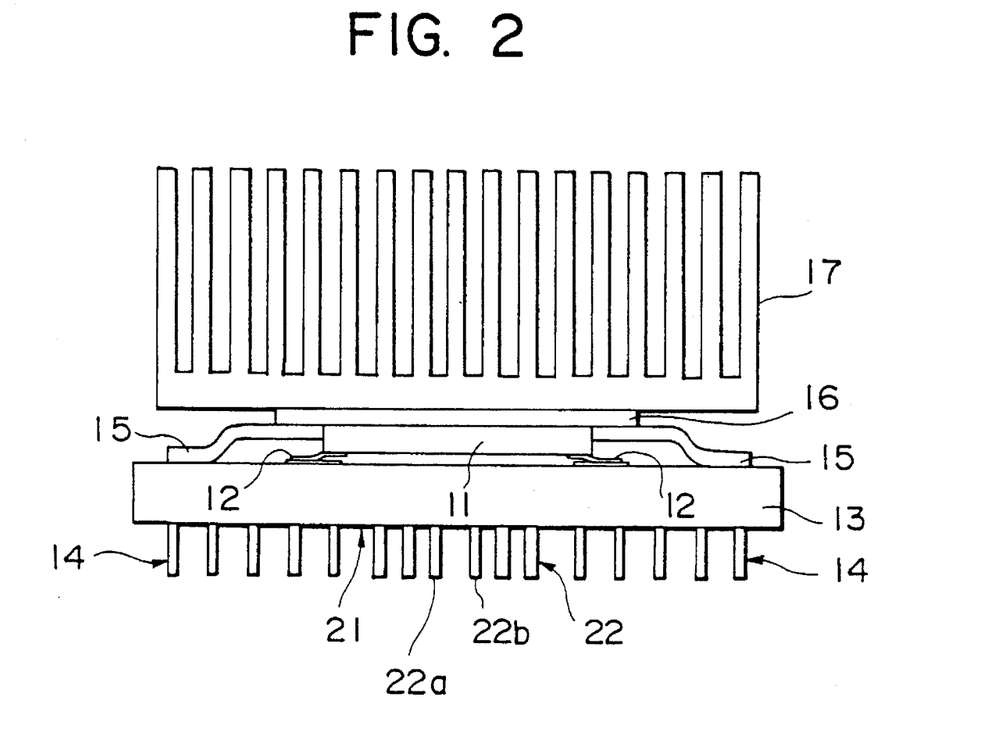
FIG. 2 illustrates a first embodiment of the present invention.

FIG. 2 illustrates a first embodiment of the present invention. The semiconductor 11 of FIG. 2 is, for example, a high-power chip and is provided with a heat sink 17, a metal cap 15, and a metal plate 16 between the heat sink and the metal cap. Bumps are formed on the face of the chip 11 with the elements, and are bonded to TAB leads 12. Bumps can alternatively be formed on the TAB leads 12. The assembly is mounted onto and connected with a ceramic package 13.

Regularly spaced first lead pins 14 (for signals for example), are provided projecting perpendicularly from the underside of the package, in 5 rows for example, at the periphery of the ceramic package. These lead pins 14 are surface mount lead pins, and are connected to the pattern formed in respective layers within the multi-layer ceramic package 13 (see FIG. 1B).

Figure 5:
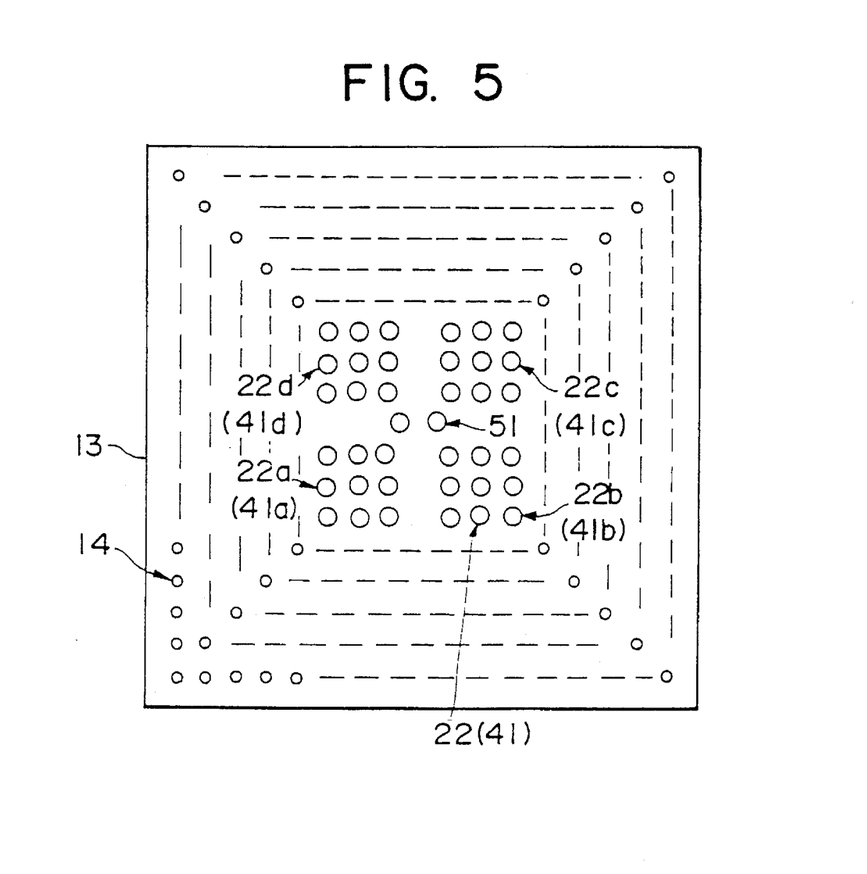
FIG. 5 illustrates a third embodiment of the present invention.

Cylindrical second lead pins 22, are provided, as lead parts each assigned for a specific use, or function toward the interior 21 of the underside of the ceramic package 13, beyond or inside the region populated with the lead pins 14, in 4 groups of 9 pins each, for example (see FIG. 5). Cylindrical lead pins 22 each assigned for a specific use or function include, for example, power lead pins 22a and 22c or ground lead pins 22b and 22d. They are larger than the lead pins 14 in thickness, and are formed for surface mount. Their use makes power circuit connection easy.

The lead pins 22 need not be cylindrical in shape, but can be of any shape including octagonal columns or hexagonal columns. The lead pins 22 are made of the same material as the lead pins 14 and are plated with gold, for example. The reason for forming the lead pins 22 thicker than the lead pins 14 is to ensure, in the present invention, that electric connection is established by eliminating a slight displacement that occurs in the prior art when mounting a semiconductor device onto a board. Accordingly, the lead pins 22 are more sparsely spaced than the lead pins 14.

While in the above embodiment a plurality of lead pins 22 are shown, providing only at least one connected lead pin 22 ensures performance.

When a semiconductor device such as the one described in the above embodiment is mounted onto a board, electric connection of 5 rows of lead pins 14 with the board is confirmable visually. The necessity of visual inspection of the lead pins 22 provided in the interior 21 is eliminated since the connection of one pin alone among 9 ensures performance.

This way, it is possible to avoid leaving any unused room on the entire underside of the ceramic package 13, in providing pins. It also becomes possible to assign the lead pins 14, provided in the periphery, for signal use only, thus allowing provision of a denser array useful for decreasing capacitance and resistance, improving high-frequency properties, and increasing the chance of down-scaling the entire composite device.

Figure 3A:
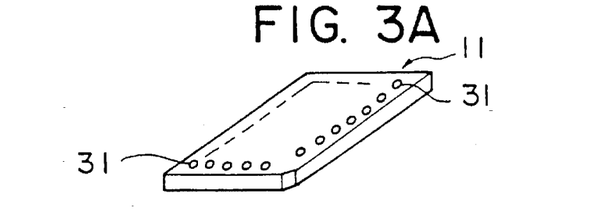
FIGS. 3A to 3F illustrate a fabrication process for the embodiment of FIG. 2.
Figure 3B:
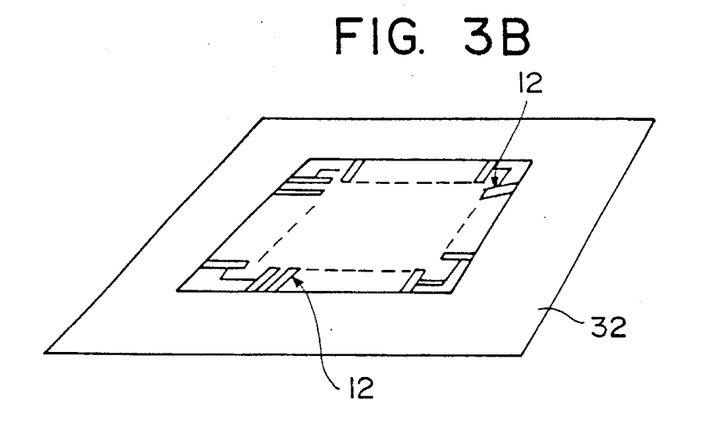
Figure 3C:
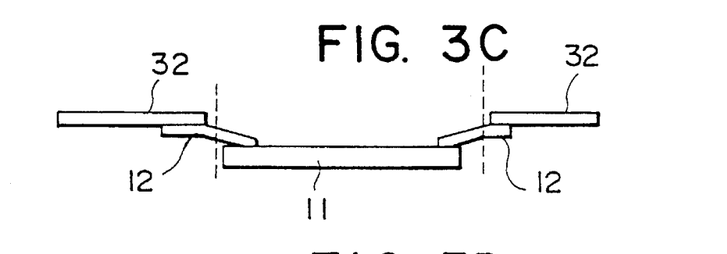

FIGS. 3A to 3F illustrate an example of a fabrication process of the embodiment of FIG. 2. First, a TAB film 32 is prepared on which TAB leads 12 are formed corresponding to a plurality of pads 31 placed on the chip 11 (FIGS. 3A, and 3B). Bumps are formed either on the pads 31 of the chip 11 or on an end of each TAB lead 12, or on both. The chip 11 is joined with the TAB leads 12 by bonding. Then the TAB leads 12 are cut from the TAB film 32 (FIG. 3C).

Figure 3D:
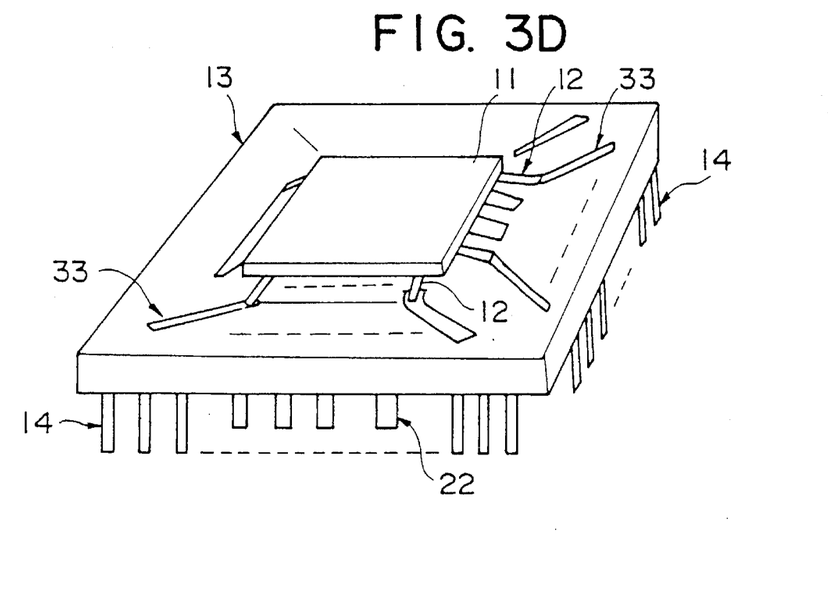

The ceramic package 13 is formed by building layers of ceramic on which specific patterns 33 have been formed. The lead pins 14 and the lead pins 22 project from the underside of the package as shown in FIG. 2 (FIG. 3D). The edge of the pattern on the uppermost layer in the ceramic package and the edge of the TAB leads 12 joined with the chip 11 are bonded by means of face down bonding (FIG. 3D).

Figure 3E:
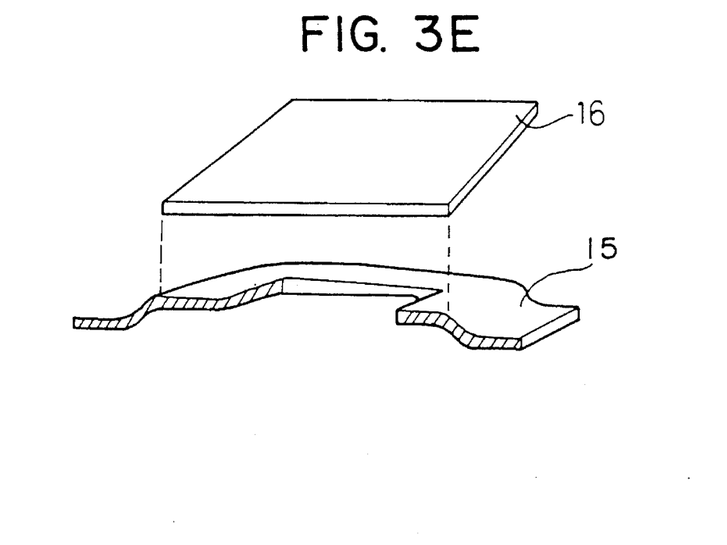
Figure 3F:
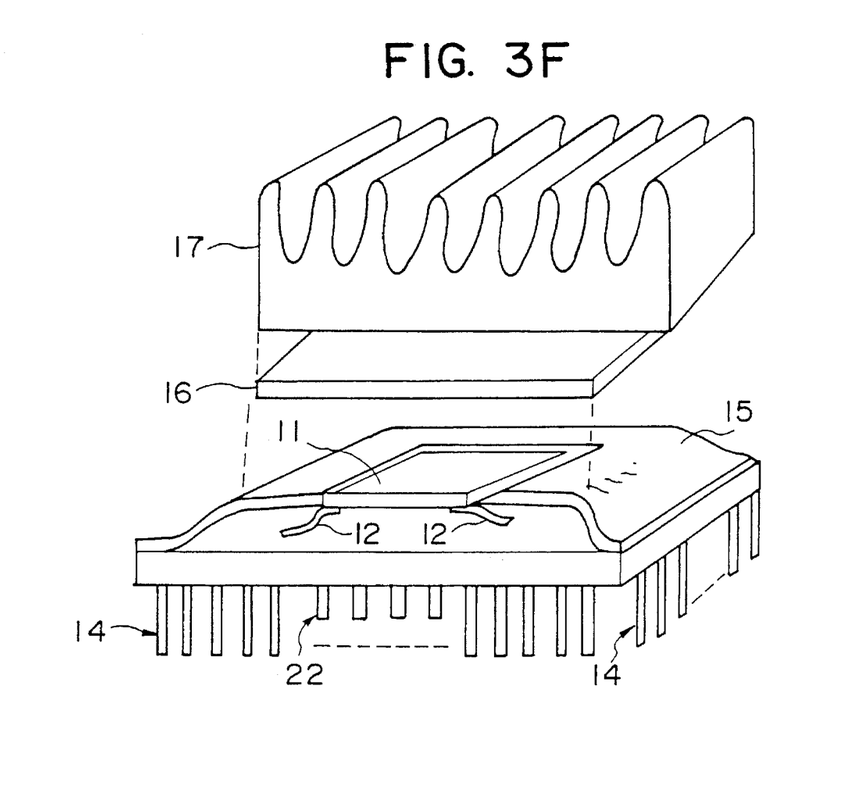

A metal cap 15 is then soldered or brazed above the uppermost layer of the ceramic package 13 in such a way as to encase the chip 11 (FIG. 3E). A metal plate 16 is soldered or brazed onto this metal cap 15 and the chip 11, then a heat sink 17 is soldered or brazed onto the metal plate 16 (FIG. 3F). The metal cap 15, the metal plate 16 and the heat sink 17 may be joined together in advance.

Figure 4:
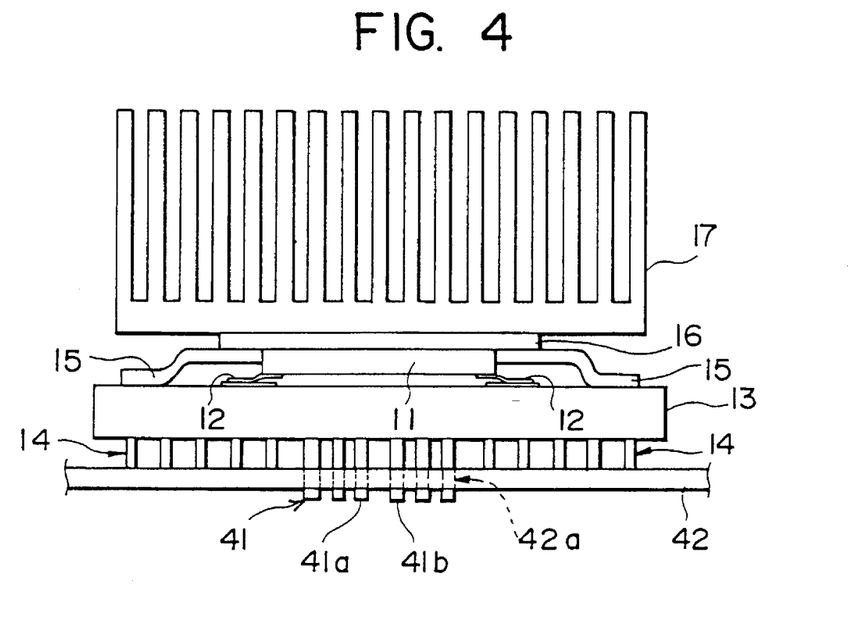
FIG. 4 illustrates a second embodiment of the present invention.

FIG. 4 illustrates a second embodiment of the present invention. A semiconductor device in FIG. 4 is shown mounted on a board 42. The semiconductor herein is essentially the same as in FIG. 2 except that it is provided with second lead pins 41 (power pins 41a and ground pins 41b, specifically) obtained by extending the second lead pins 22 of the previous embodiment so that they are longer than the first lead pins 14 at the periphery. In this case, corresponding positions on the board for mounting of the composite device, are provided with through-holes 42a to allow the lead pins 41 to go through. In other words, the lead pins 14 at the periphery are surface mounted, while the lead pins 41 are mounted by soldering, for example by allowing them to go through the through-holes 42a.

The above construction allows the lead pins 41 to serve as an insertion guide into the through-holes 42a, facilitating alignment during surface mounting. Direct connection of the lead pins 41 with the board 42 decreases the inductance component.

Connection of the lead pins 41 with the board 42 can easily be inspected visually by looking at underside of the board 42 since the lead pins 41 go through the board 42.

FIG. 5 is a bottom view of a third embodiment of the present invention. In the semiconductor device shown in FIG. 5, the lead pins 22 (41) such as those shown in FIGS. 2 and 4 are provided in such a manner that they encompass one or more terminals 51 assigned for use as, for example, clock pins in semiconductor circuits. It is possible thus to attain increased stability in the operation of the device due to encompassing the terminals 51 with the lead pins 22 (41), which are not susceptible to fluctuation in potential as they are assigned as power and signal pins, thus preventing noise.

The terminals 51 ensure a secure mounting, by eliminating displacement that occurs when mounting the composite device on the board, by forming the terminals so as to be thicker than the lead pins 14 as in the case of the lead pins 22 (41).

Figure 6:
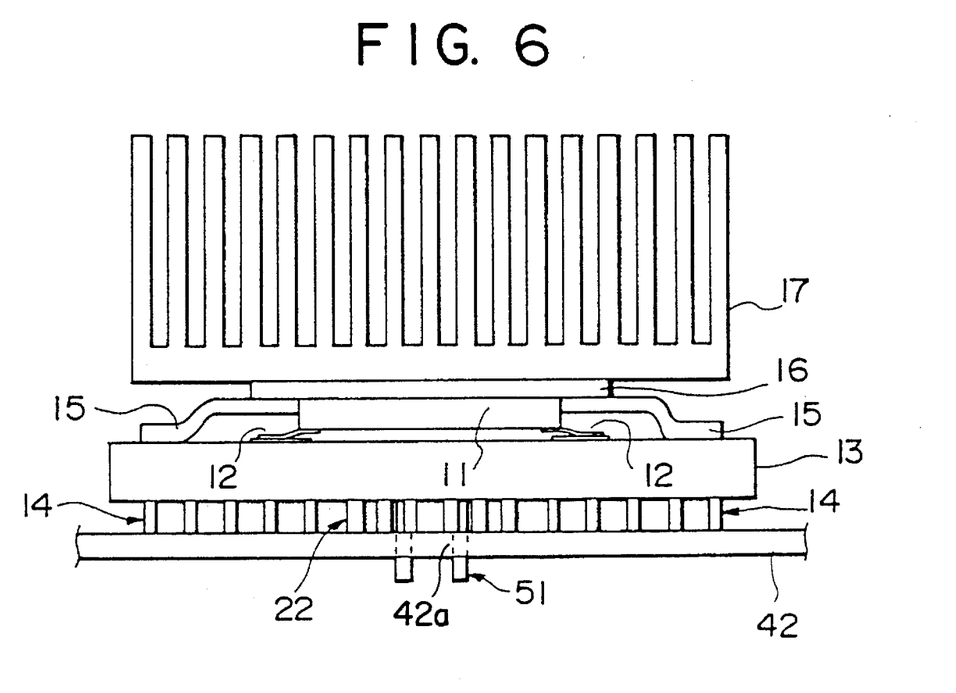
FIG. 6 illustrates a variation of the embodiment of FIG. 5.

FIG. 6 illustrates a variation of the embodiment of FIG. 5. The terminals 51 in FIG. 6 are formed longer than the lead pins 22. In this case, through-holes 42a are drilled on a board 42 for mounting of the composite, and the terminals 51 extend through the through-holes 42a to be soldered on the board. Here, the terminals 51 can serve as a guide in mounting. Alternatively, the lead pins here can be like the lead pins 41 in FIG. 4, which are longer than the lead pins 14. They can also go through the board 42 and be fixed. By using these methods, visual inspection of the solder joint is possible from the underside of the board.

Figure 7A:
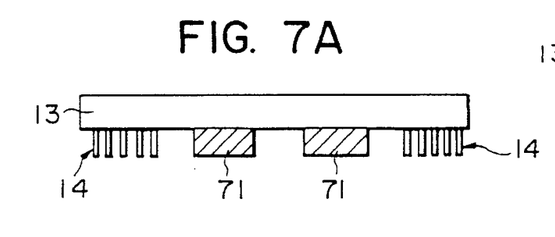
FIGS. 7A, 7B, 8A, 8B, 9A and 9B illustrate variations of any of the first, second or third embodiment above.
Figure 7B:
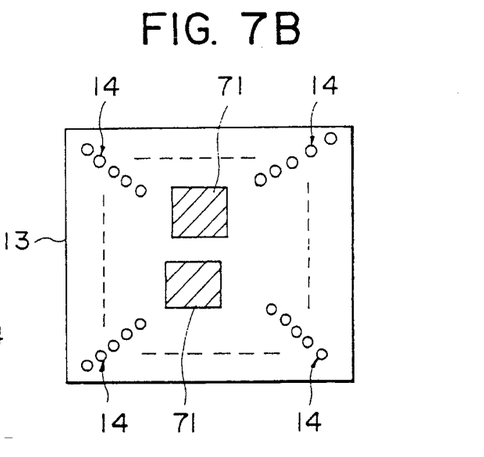
Figure 8A:
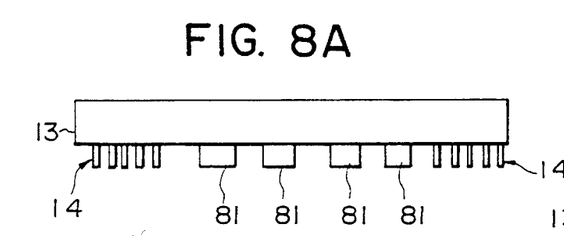
Figure 8B:
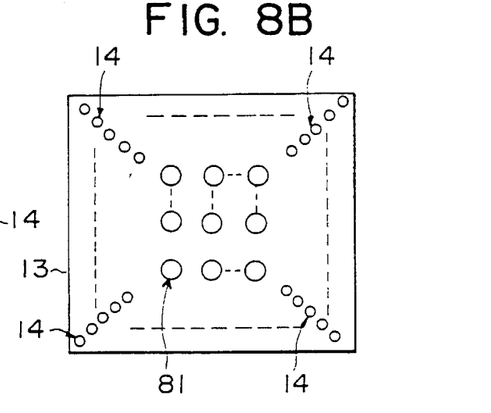
Figure 9A:
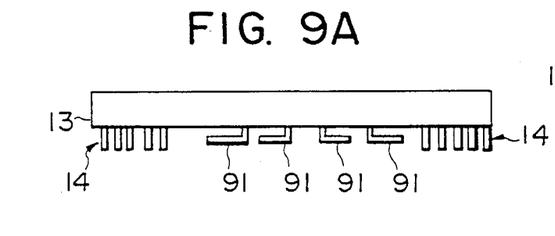
Figure 9B:
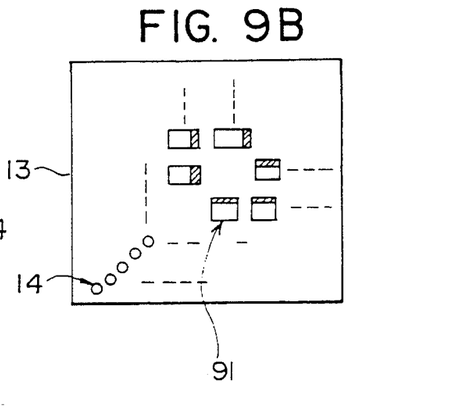

FIGS. 7 to 9 illustrate variations of the above embodiment.

FIG. 7A is a cross-sectional view, and FIG. 7B is a partial bottom view. The chip 11 on upper side, the heat sink 17, etc. will be left out of the diagrams hereinafter through FIG. 9B. The semiconductor device in FIGS. 7A and 7B is fabricated in such a way that square-shaped one or more lead parts 71 that look like a block are provided toward the interior 21 on the underside of the package 13 beyond the region populated with the lead pins 14. These lead parts 71 can be assigned as power pins in the semiconductor circuit, for example. With this semiconductor device it is possible to achieve a wide contact area with the board when mounting the composite, and to have the composite soldered to the corresponding pattern on the board with accuracy, even when displacement occurs. This way, the process of visual inspection of connections can be eliminated.

FIG. 8A is a partial cross-sectional view, and FIG. 8B is a partial bottom view. The semiconductor device shown in FIGS. 8A and 8B is fabricated in such a way that cylindrical block-shaped lead parts 81 are provided in place of the lead parts 71 shown in FIGS. 7A and 7B, for the same use. These lead parts 81 are spaced more sparsely than the lead pins 14 and are surface mounted as in FIGS. 7A and 7B. Accordingly, because the lead parts 81 are block-shaped, a more secure connection with the board is achieved, and the process of visual inspection can be eliminated.

FIG. 9A is a partial cross-sectional view, and FIG. 9B is a partial bottom view. The semiconductor device shown in FIGS. 9 and 9B is fabricated in such a way that lead parts 91 having an L-plate shape, are provided in place of the lead parts 71 or 81 above. The usefulness of this configuration when the composite is mounted on the board is the same as that of the configuration with the lead parts 71 or 81.

Figure 10:
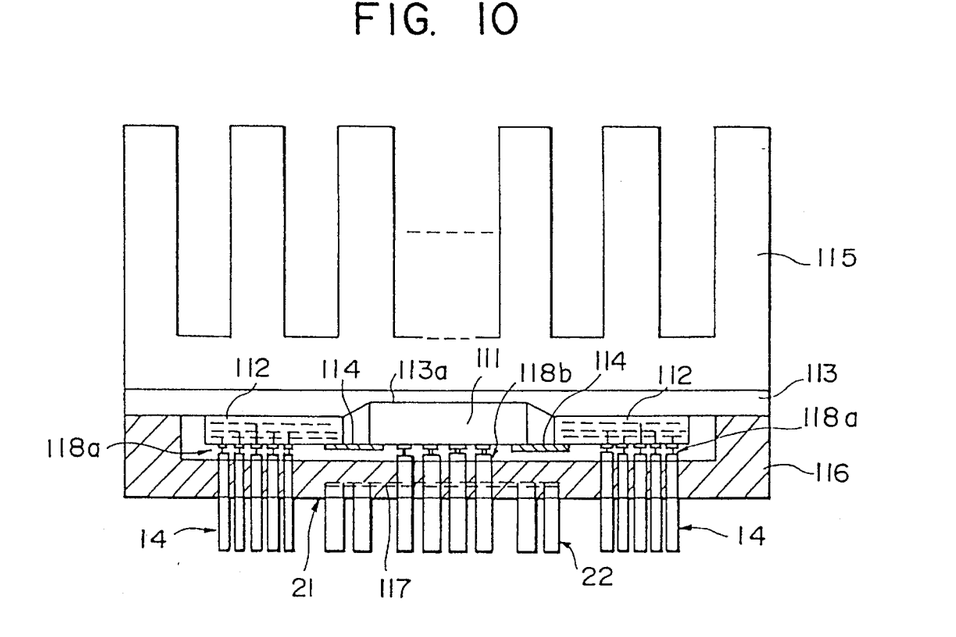
FIG. 10 illustrates a fourth embodiment of the present invention.

FIG. 10 illustrates a fourth embodiment of the present invention. The semiconductor device shown in FIG. 10 is fabricated in such a way that a high-power chip 111 is mounted in a depression 113a formed on a metal base 113. A thin film 112 is positioned on the same plane as the upper surface of the chip. The chip is joined to the thin film 112 on both ends of the face with the elements, through TAB leads 114, with the use of bumps. These thin films 112 are TABs produced by layering thin films (made of polyimide, etc.) etched with fine patterns, and are supplied with signal pads (described later) for connection with the TAB leads 114 and pins to be described later. That is, this thin film 112 acts to disperse the layout of the lead pins connected thereto. The metal base 113 on which the chip 111 and other things are mounted is soldered or brazed to an underside of a heat sink 115 formed of a material such as aluminum. This metal base 113 is formed of a material such as CuMo, and is designed for making compatible the coefficients of thermal expansion between the chip 111 and the heat sink 115 as they are bonded together.

The package 116 is fabricated in such a way that it allows first signal lead pins 14 to project at the periphery of its underside; it also allows second lead pins 22, each assigned for a specific use, to project from a region toward the interior 21 of the underside, and is provided with a depression (PGA type). The signal lead pins 14 project perpendicularly in 4 to 6 rows and are spaced regularly, so that they can be visually inspected when mounted on the board. The package 116 comprises layers of ceramic etched with a power plane 117, which is a power supply pattern. A predetermined number of lead pins 22 connected with the power plane 117 is provided in the interior 21 on the underside of the package 116. These lead pins 22 are formed thick enough to make them differentiable from the signal lead pins 14, and to eliminate displacement while mounting the composite onto the board. They are used, for example, as power pins, or as clock pins sealed by the power pins.

The package 116 is then fitted to the metal base 113 with adhesive, for example. The signal lead pins 14 are electrically connected with signal pads on the thin film 112 through contact pins 118a placed in a pressurized contact with the pads. Some of the lead pins 22 and power supply pads formed on the chip 111 are electrically connected through contact pins 118b.

A semiconductor device such as this can be made thin since it requires only the power plane 117 inside the package 116. Use compatible with semiconductor devices having chips of other functions is also possible. Direct contact of the power lead pins 22 with the chip 111 assures low impedance because an intermediate conductor pattern is eliminated. Moreover, even if the metal base 113 is taken away from the package 116 it is restorable since the connections among the first lead pins 14, the second lead pins 22, the chip 111, and the thin film 112 are achieved by pressurized contact only, with the use of the contact pins 118a and 118b. This makes failure analysis of the device easier, and improves fabrication yield. Moreover, since a group of inner power leads 22 are provided in the interior, thus increasing the likelihood that electric contact is established, the process of visual inspection of the connection can be eliminated when mounting such a semiconductor device onto the board.

While FIG. 10 shows the electrical connection of the lead pins 14 and 22 with the thin film 112 achieved by means of the contact pins 118a and 118b, use of bumps instead can make the device smaller in proportion to the dimensions of the contact pins 118a and 118b.

Figure 10A:
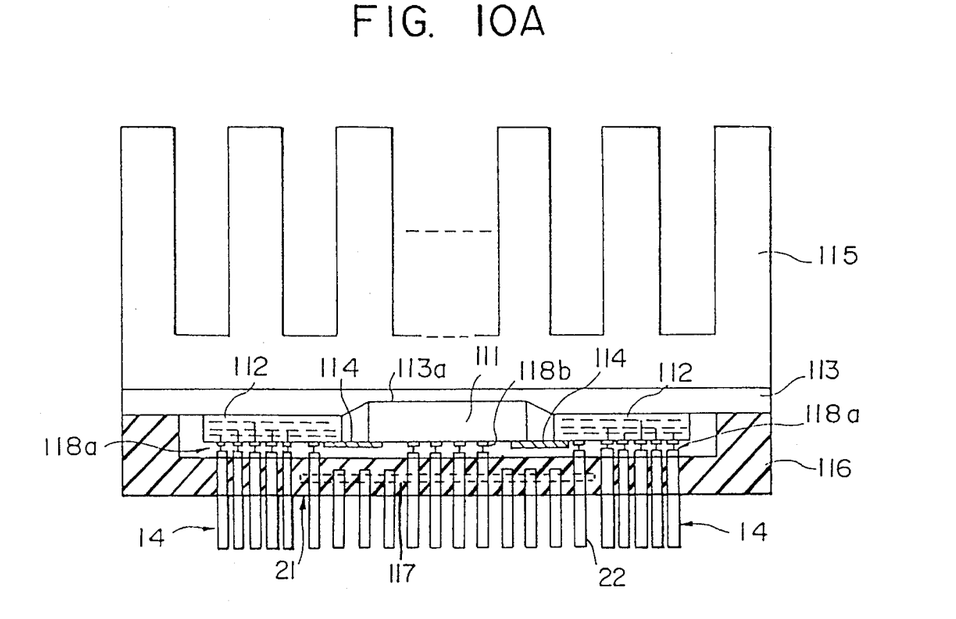
FIG. 10A illustrates a modification of the fourth embodiment.

Direct connection of some of the lead pins 22 with the chip 111 in this embodiment may be replaced by another connection means, wherein the pins are connected with the chip 111 through the thin film 112 by means such as TAB leads, for example, as shown in FIG. 10A. In this manner the structure is simplified and crosstalk arising from the signal lead pins 14 is prevented.

The lead pins 22 can also serve as a guide when mounting the composite if they are made longer than the lead pins 14, as shown in FIG. 4.

Figure 11A:
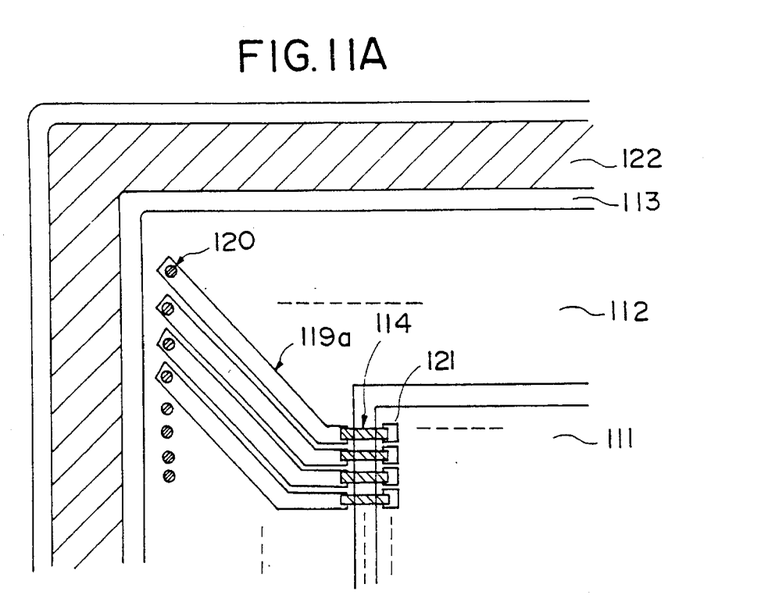
FIGS. 11A to 11C illustrate a fifth embodiment of the present invention.
Figure 11B:
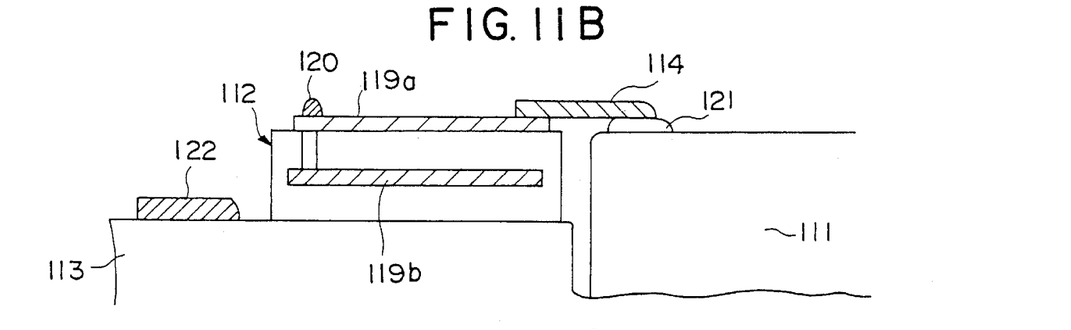
Figure 11C:
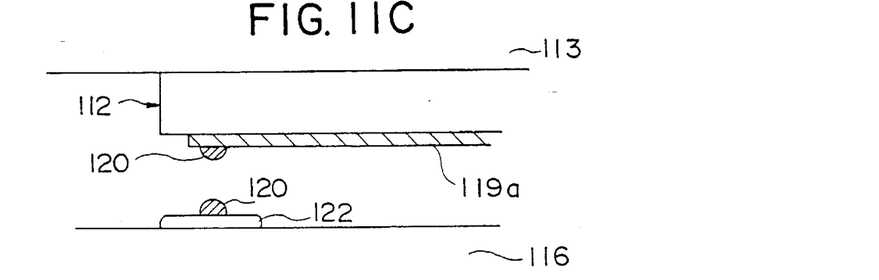

FIGS. 11A to 11C illustrate a fifth embodiment of the present invention. In this embodiment, the contact pins 118a and 118b in FIG. 10, used for connections among the lead pins 14, 22, the film 112 and the chip 111, are replaced by bumps. Accordingly, FIGS. 11A to 11C are partial cross-sectional views showing an area in which bumps are formed. Configuration other than as concerns the bumps remains the same as in FIG. 10.

FIG. 11A is a part of a top cross-sectional view, and FIG. 11B is a part of a side cross-sectional view showing a relationship between a chip and a thin film. In FIGS. 11A and 11B, a chip 111 is mounted onto a metal base 113. Near the periphery of the chip, the thin film 112 is positioned on the same plane as the topside of the chip. A signal pattern 119a, for example, and a power pattern 119b, for example, are formed on the thin film 112, each layer being connected by through-holes.

The topmost pattern 119a of the thin film 12 has a bump 120 at one end thereof, while the other end is connected to a pad 121 of the chip 111 via a TAB lead 114. Around the thin film 112 is formed a seal pattern 122. The thin film 112 here differs from the thin film 112 in FIG. 10 in that it includes a bump.

FIG. 11C illustrates a relationship between the thin film and the lead pins. FIG. 11C shows that the bump 120 formed on the pattern 119a of FIGS. 11A and 11B, and the bump 120 formed on the pattern 122 provided on the surface of the package 116 are completely joined by pressure. This happens between each pattern 119a and a corresponding lead pin 14, so as to establish an electrical connection.

Figure 12A:
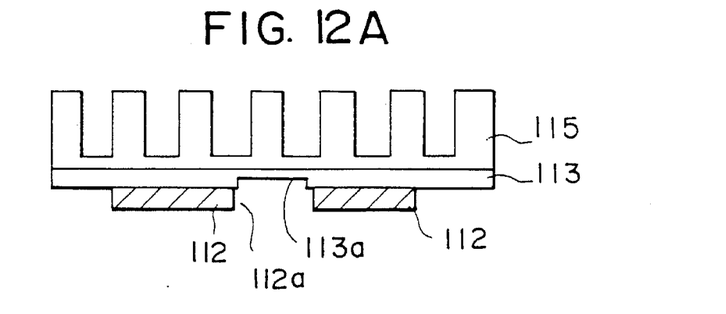
FIGS. 12A to 12D illustrate a fabrication process for the embodiment of FIGS. 11A to 11C.
Figure 12B:
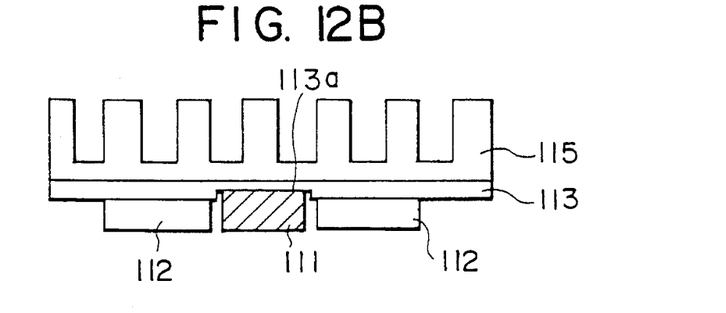
Figure 12C:
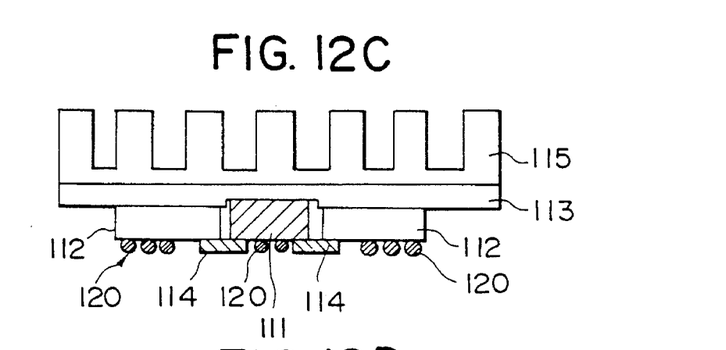
Figure 12D:
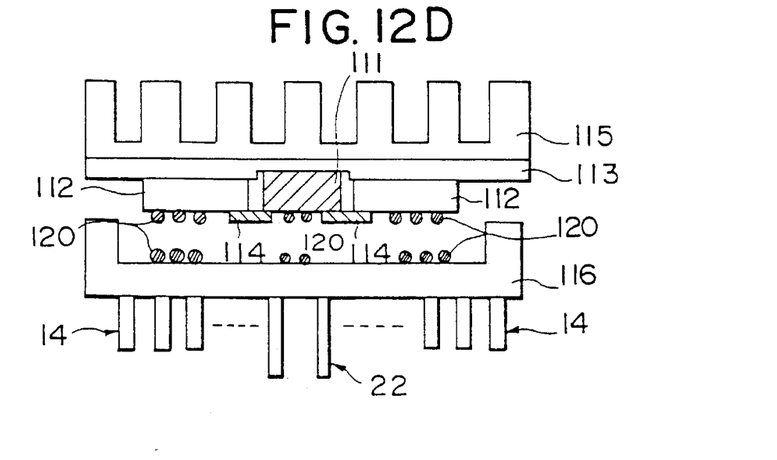

FIGS. 12A to 12D illustrate an example of fabrication of the device of FIGS. 11A to 11C. First, FIG. 12A shows that a thin film 112 having an opening 112a that corresponds to a depression 113a is formed around the depression 113a provided in a metal base 113 attached to a heat sink 15. FIG. 12B shows a chip 111 mounted onto the depression 113a of the metal base 113. FIG. 12C shows that the chip 111 and the thin film 112 are connected via TAB leads 114, as shown in FIGS. 11A and 11B. Bumps 120 are formed on the the chip 111 and the thin film 112. FIG. 12D shows that the patterned portion of a package 116 formed so as to connect to lead pins 14 and 22 projecting from the surface of the package 116, is provided with bumps 120. Connection is established by pressure joining the bumps 120 on the package against the corresponding bumps 120 formed on the chip 111 and the thin film 112 so that the connection is complete. The package 116 and the periphery of the metal base 113 are then sealed by soldering.

The semiconductor device of the prior art shown in the FIG. 1 has a disadvantage in that it is difficult to judge whether such parts as the chip and the metal base are firmly united. It also leaves a possibility of solder leakage between the chip and the metal base. With the semiconductors fabricated in the process of the present invention, on the other hand, it is sufficient to have the periphery of the package 116 and the metal base 113 united and inspection is easy.

The power lead pins 22 can be alternatively connected via the thin film 112 by providing a pattern on the package 116, thus eliminating a direct connection with the chip 111. In this way crosstalk can be avoided just as surely as in the above mentioned manner.

Figure 13A:
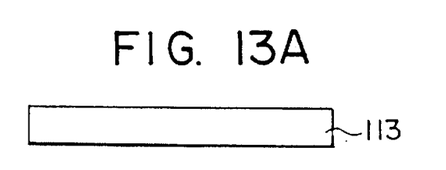
Figure 13B:
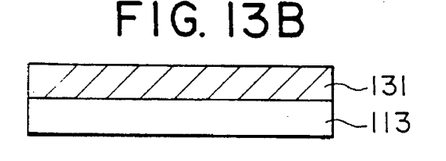
Figure 13C:
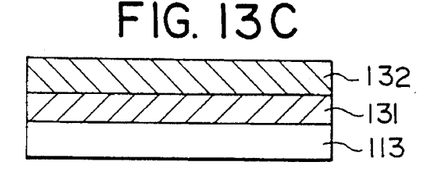
Figure 13D:
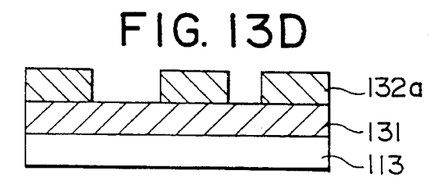
Figure 13E:
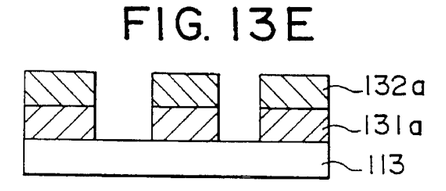

FIGS. 13A to 13I illustrate an example of a process for forming the thin film such as the one shown in the FIG. 12A. First, a metal layer 131 is formed on a metal base 113 (FIG. 13A) by a method such as evaporation (FIG. 13B). The metal layer 131 is treated with photoresist 132 (FIG. 13C), and a pattern 132a is formed after lithography and a development process (FIG. 13D). The metal layer 131 is then etched to create a pattern 131a (FIG. 13E). The photoresist pattern 132a is then removed (FIG. 13F).

Figure 13G:
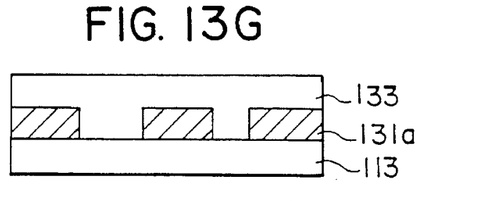
Figure 13H:
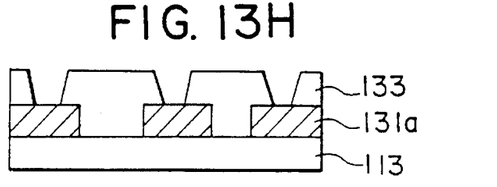
Figure 13I:
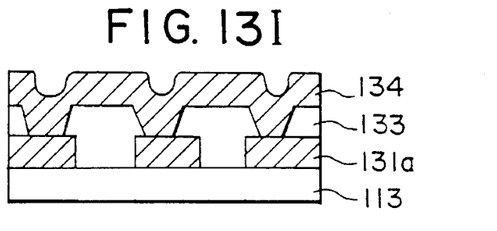

Photosensitive polyimide 133 is then spin coated onto the metal pattern 131a (FIG. 13G), which is exposed after the lithography and development process. After the polyimide 133 is hardened by heating (FIG. 13H), metal layer 134 is formed by a process such as evaporation, and is connected with the metal pattern 131a below (FIG. 13I).

A repetition of these processes in building 4 or 5 layers forms a thin film 112.

Although it is not shown in the figure, an opening 112a of FIG. 12A is formed in each layer formed in the above process.

Figure 14A:
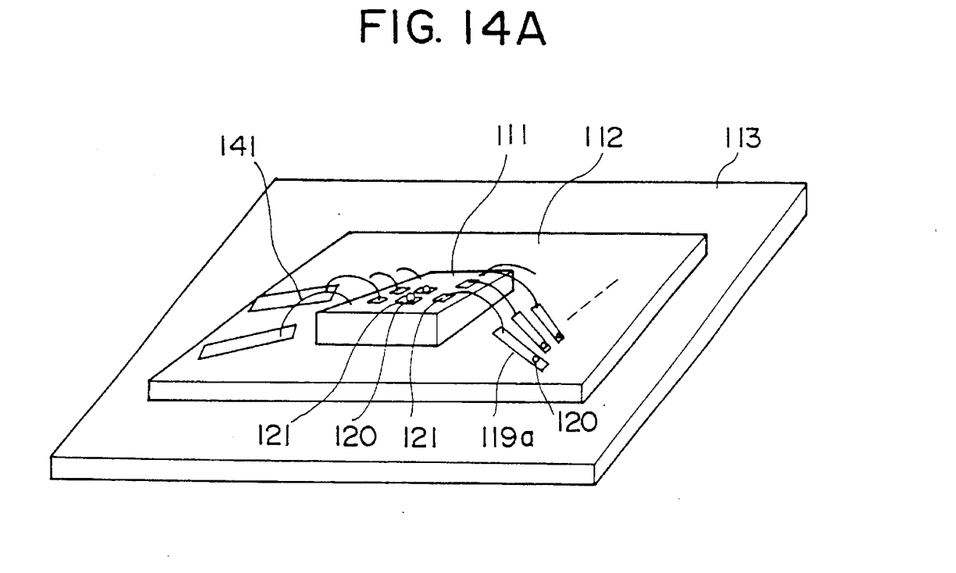
FIGS. 14A and 14B illustrate another fabrication process for the embodiment of FIGS. 11A to FIG. 11C.

FIGS. 14A and 14B illustrate another example of a fabrication process of the device of FIGS. 11A to 11C. FIG. 14A shows a process in which the opening 112a of the FIG. 12A is not formed, but wherein a thin film 112 is formed by building 4 or 5 layers of patterned polyimide on a metal base 113 (see FIGS. 13A to 13I). A chip 111 is mounted onto this thin film 112, and the chip 111 and the pattern on the thin film 112 are bonded by a wire 141. Bumps 120 are formed on one end of a pattern 119a on the thin film 112 and on a pad 121 on the chip 111.

Figure 14B:
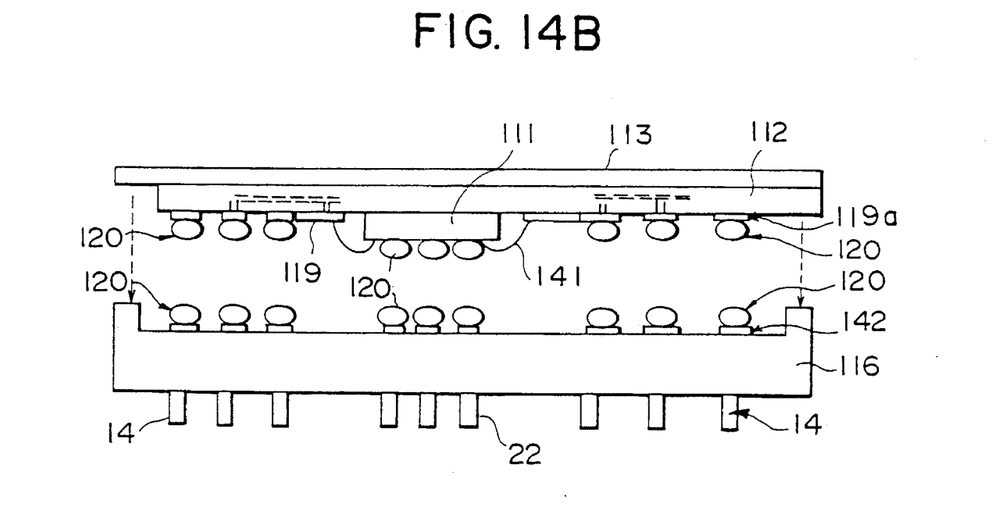

FIG. 14B shows a pattern 142 formed on a layer-built package 116 comprising lead pins 14 and 22 projecting from the underside of the package. Bumps 120 are formed on the end of the pattern. Pressure joining the bumps 120 on the chip 111 and the thin film 112 to the corresponding bumps 120 on the pattern 142 unites the composites.

Figure 15:
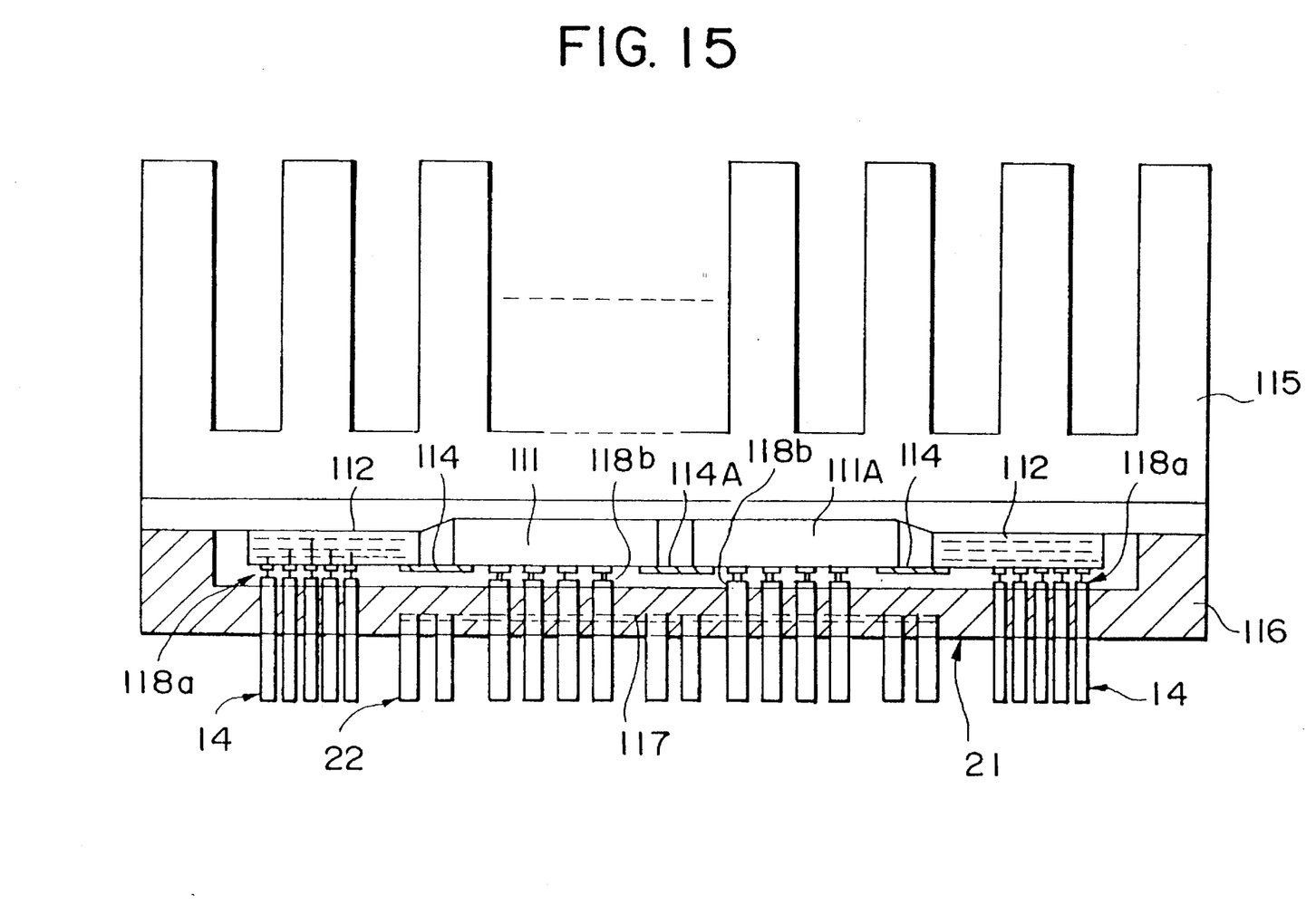
FIG. 15 illustrates a sixth embodiment of the present invention.

FIG. 15 illustrates a sixth embodiment of the present invention. A semiconductor device shown in FIG. 15 is a side cross-sectional view of a multi-chip embodiment. FIG. 15 shows chips 111 and 111A connected through TAB leads 114A. Other configurations remain the same as the semiconductor device of FIG. 10. This exemplifies a multi-chip embodiment, which was impossible in the prior art.

While FIG. 15 shows the chips 111 and 111A connected through the TAB leads 114A, this arrangement can be replaced by a configuration where a thin film comprising patterned polyimide layers is interposed between the chips 111 and 111A so that TAB leads can connect them.

Connection between the chips 111 and 111A, and the thin film 112 can be accomplished by wire-bonding as illustrated in FIG. 14 and 14B.

In the fifth and sixth embodiments above, the lead pins 22 are described as having the role, in surface mounting, as in the embodiment of FIG. 2. Accordingly, the function of these lead pins 22 is the same as that described in FIG. 2. When extended to be as those shown in FIG. 4, these lead pins function in the same way as in the embodiment of FIG. 4. When terminals 51 are provided as shown in FIGS. 5 and 6, the terminals have the same function as in FIGS. 5 and 6. The lead pins 22 may alternatively be formed into shapes as shown in any of FIGS. 7 to 9.

While the use of a ceramic package was assumed in the first to sixth embodiments above, a package formed with such resin as epoxy, or metal, also assures performance. Further, these embodiments have the same utility with semiconductor devices fitted with a chip not needing a heat sink.

Figure 16A:
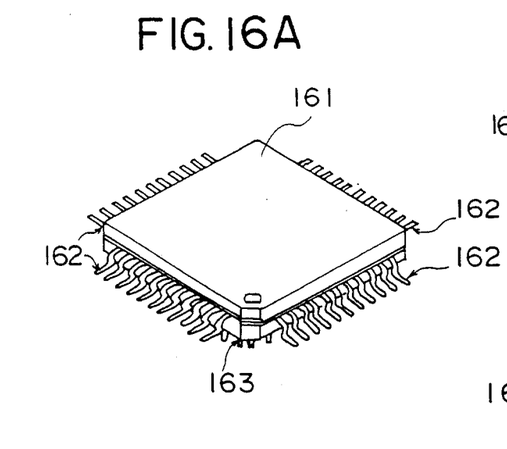
FIGS. 16A and 16B illustrates a seventh embodiment of the present invention.
Figure 16B:
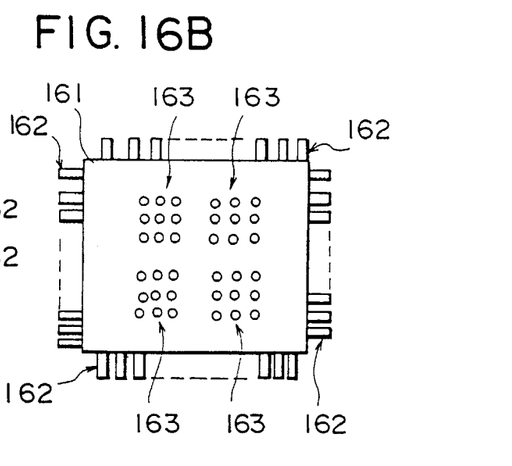

FIGS. 16A and 16B illustrate a seventh embodiment of the present invention. While the use of a PGA type semiconductor device was assumed in any of the first to sixth embodiments above, this embodiment comprises a QFP (Quad Flat Package) type semiconductor device.

In the semiconductor device shown in FIGS. 16A and 16B, lead pins 162 project from all four sides of a package (ceramic or resin mold) 161, and are shaped like L-plates for the purpose of surface mounting. Moreover, at least one lead part 163 projects from the underside of the package. Lead part 163 can be of any form including those of the lead pins 22, 41, and the lead parts 71, 81, 91 above. Clock terminals 51 are provided, when needed. With this configuration, the vacant region of a QFP type package can be utilized effectively.

Figures 17A, 17B:
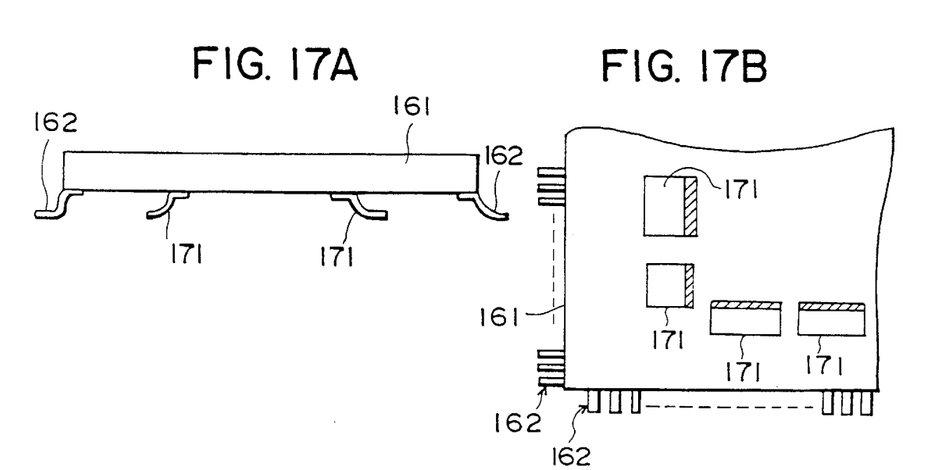
FIGS. 17A and 17B illustrate a variation of the embodiment of FIG. 16.

FIGS. 17A and 17B illustrate a variation of the embodiments of FIG. 16. In a QFP type semiconductor shown in FIG. 17, lead parts 171 with the shape of L-plates are provided on the underside of a package 161.

Thus, any of the first to seventh embodiments show that it is possible to provide pins effectively by providing lead parts, each assigned for specific use, in the otherwise unoccupied region on the underside of the package, and to ensure that the connection is established when mounting the composite onto the board, and to eliminate the process of visual inspection. The present invention also makes layer-building of the package easy and facilitates down-scaling. Providing power lead parts on the underside of the package ensures a high density of signal lead pins, and increases the capacity of a semiconductor integrated circuit.

As explained above, the present invention allows effective pin array placement on the entire underside of a package, and eliminates the process of visual inspection when mounting the composite onto the board, thus realizing high density and greater capacity of the semiconductor device.

The present invention can find applications in high-density semiconductor devices including a PGA type and a QFP type.

I claim:

1. A semiconductor device comprising;
   a predetermined number of surface mount first lead pins arranged in a region around the periphery of an underside of a package, said package having a chip attached thereto; and
   a plurality of surface mount second lead pins provided in a center region of the underside of said package inside of the region containing said first lead pins;
   said second lead pins being arranged in a plurality of spaced groups, each of said groups having a specific function and being comprised of a plurality of said second lead pins and the distance between adjacent groups being greater than the distance between the second lead pins in any one of said groups.

2. A semiconductor device as claimed in claim 1, wherein said first lead pins project from all four sides of said package.

3. A semiconductor device as claimed in claim 1, wherein said second lead pins function as a power supply system in a semiconductor circuit.

4. A semiconductor device as claimed in claim 1, wherein said second lead pins are thicker than said first lead pins.

5. A semiconductor device as claimed in claim 1, which further comprises at least one terminal having a specific function and located within the region of said second lead pins.

6. A semiconductor device comprising:
   a predetermined number of surface mount first lead pins arranged in a region around the periphery of an underside of a package fitted with a chip;
   a first thin film built in layers of patterned film for connecting said chip and said first lead pins, said first thin film being positioned inside said package and said chip being connected to said first lead pins through said first thin film; and
   at least one second lead pin having a specific function and connected to said chip without being connected through said first thin film, said second lead pin being located near a center region inside of the region populated with said first lead pins.

7. A semiconductor device comprising:
   a predetermined number of surface mount first lead pins arranged in a region around the periphery of an underside of a package fitted with a chip;
   a first thin film built in layers of patterned film for connecting said chip and said first lead pins;
   at least one second lead pin having a specific function and connected to said chip through said first thin film, said second lead pin being located near a center region inside of the region populated with said first lead pins;
   and wherein said first thin film is positioned inside said package and said chip is connected to said first lead pins and said at least one second lead pin through said first thin film.

8. A semiconductor device as claimed in claim 7, which includes a plurality of chips fitted on said package, said chips being connected together by a second thin film.

9. A semiconductor device according to claim 1, wherein
   at least one of said second lead pins is longer than said first lead pins, said at least one second lead pin further having a column shape and serving as a guide pin when mounting the device on a board.

10. A semiconductor device comprising:
    a predetermined number of surface mount first lead pins arranged in a region around the periphery of an underside of a package fitted with a chip; and
    a plurality of surface mount second lead pins (22), each having a specific function and provided in a region near a center region of the underside of said package inside of the region populated with said first lead pins, at least two of said second lead pins being assigned to each specific function of said second lead pins; and
    at least one terminal having a specific function and located within the region of said second lead pins, said terminal being longer than said first lead pins whereby when the device is mounted on a board said terminal extends through said board and is fixed thereto.

11. A semiconductor device as claimed in claim 10, wherein said terminal functions as a guide when mounting the device on said board.

12. A semiconductor device as claimed in claim 10, wherein said terminal functions as a clock terminal in the semiconductor circuit.

13. A semiconductor device comprising:
    a predetermined number of surface mount first lead pins arranged in a region around the periphery of an underside of a package fitted with a plurality of chips;
    a first thin film built in layers of patterned film for connecting said chips and said first lead pines;
    at least one second lead pin having a specific function and connected to said chips without being connected through said thin film, said second lead pin being located near a center region inside of the region populated with said first lead pins; and
    a second thin film connecting said chips.

* * * * *